US011001036B2

(12) United States Patent
Nagata et al.

(10) Patent No.: US 11,001,036 B2
(45) Date of Patent: May 11, 2021

(54) SAPPHIRE COMPOSITE BASE MATERIAL AND METHOD FOR PRODUCING THE SAME

(71) Applicant: SHIN-ETSU CHEMICAL CO., LTD., Tokyo (JP)

(72) Inventors: Kazutoshi Nagata, Annaka (JP); Yoshihiro Kubota, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 250 days.

(21) Appl. No.: 16/062,707

(22) PCT Filed: Dec. 16, 2016

(86) PCT No.: PCT/JP2016/087542
§ 371 (c)(1),
(2) Date: Jun. 15, 2018

(87) PCT Pub. No.: WO2017/104799
PCT Pub. Date: Jun. 22, 2017

(65) Prior Publication Data
US 2018/0361713 A1 Dec. 20, 2018

(30) Foreign Application Priority Data
Dec. 17, 2015 (JP) .............................. JP2015-246397

(51) Int. Cl.
*B32B 17/06* (2006.01)
*B32B 37/00* (2006.01)
(Continued)

(52) U.S. Cl.
CPC ................ *B32B 17/06* (2013.01); *B32B 7/12* (2013.01); *B32B 17/064* (2013.01);
(Continued)

(58) Field of Classification Search
CPC .............. B32B 17/06; B32B 17/10036; B32B 17/10119; B32B 37/025; B32B 37/18;
(Continued)

(56) References Cited

U.S. PATENT DOCUMENTS 5,340,654 A    8/1994  Ueda et al.
6,216,491 B1 * 4/2001  Fehlner ................. C03C 17/225
                                            65/25.3
(Continued)

FOREIGN PATENT DOCUMENTS

CN    102941713 A    2/2013
CN    103568406 A    2/2014
(Continued)

OTHER PUBLICATIONS

Aug. 15, 2019 Japanese Office Action issued in Japanese Patent Application No. 2017-556463.
(Continued)

*Primary Examiner* — Mark A Osele
*Assistant Examiner* — Christopher C Caillouet
(74) *Attorney, Agent, or Firm* — Oliff PLC

(57) ABSTRACT

A sapphire composite base material including: an inorganic glass substrate, a polyvinyl butyral or silica intermediate film on the inorganic glass substrate, and a single crystal sapphire film on the intermediate film. There is also provided a method for producing a sapphire composite base material, including steps of: forming an ion-implanted layer inside the single crystal sapphire substrate; forming a polyvinyl butyral or silica intermediate film on at least one surface selected from the surface of the single crystal sapphire substrate before or after the ion implantation, and a surface of an inorganic glass substrate; bonding the ion-implanted surface of the single crystal sapphire substrate to the surface of the inorganic glass substrate via the interme- (Continued)

diate film to obtain a bonded body; and transferring a single crystal sapphire film to the inorganic glass substrate via the intermediate film.

6 Claims, 4 Drawing Sheets

(51) Int. Cl.
*C03C 27/00* (2006.01)
*C30B 33/06* (2006.01)
*C30B 29/20* (2006.01)
*B32B 17/10* (2006.01)
*C30B 33/04* (2006.01)
*B32B 7/12* (2006.01)
*B32B 37/12* (2006.01)
*B32B 37/18* (2006.01)
*B32B 38/00* (2006.01)
*C03C 17/27* (2006.01)
*C03C 17/32* (2006.01)
*C30B 31/22* (2006.01)

(52) U.S. Cl.
CPC .. *B32B 17/10036* (2013.01); *B32B 17/10119* (2013.01); *B32B 17/10761* (2013.01); *B32B 37/025* (2013.01); *B32B 37/1284* (2013.01); *B32B 37/18* (2013.01); *B32B 38/0036* (2013.01); *C03C 17/27* (2013.01); *C03C 17/32* (2013.01); *C03C 27/00* (2013.01); *C30B 29/20* (2013.01); *C30B 31/22* (2013.01); *C30B 33/04* (2013.01); *C30B 33/06* (2013.01); *B32B 2255/20* (2013.01); *B32B 2255/24* (2013.01); *B32B 2255/26* (2013.01); *B32B 2305/72* (2013.01); *B32B 2307/584* (2013.01); *B32B 2315/08* (2013.01); *B32B 2457/20* (2013.01); *Y10T 156/1057* (2015.01)

(58) Field of Classification Search
CPC .......... B32B 2307/584; B32B 2315/08; B32B 2457/20; B32B 38/0004; Y10T 156/1057
See application file for complete search history.

(56) References Cited

U.S. PATENT DOCUMENTS

| | | | |
|---|---|---|---|
| 6,346,718 | B1 | 2/2002 | Yamanaka et al. |
| 6,928,215 | B1* | 8/2005 | Lui .......................... G02B 6/26 385/39 |
| 2002/0056837 | A1 | 5/2002 | Yamanaka et al. |
| 2007/0068375 | A1* | 3/2007 | Jones ..................... F41H 5/0407 89/36.02 |
| 2009/0133819 | A1 | 5/2009 | Moriceau et al. |
| 2013/0040437 | A1 | 2/2013 | Maeda et al. |
| 2013/0236699 | A1 | 9/2013 | Prest et al. |
| 2014/0133074 | A1* | 5/2014 | Zahler ................... G06F 1/1626 361/679.01 |
| 2016/0035999 | A1 | 2/2016 | Ii |
| 2016/0308184 | A1* | 10/2016 | Joo ...................... H01M 50/403 |
| 2018/0138019 | A1* | 5/2018 | Shindo ..................... A61C 5/77 |

FOREIGN PATENT DOCUMENTS

| | | |
|---|---|---|
| CN | 103707578 A | 4/2014 |
| JP | H05-333164 A | 12/1993 |
| JP | H08-269690 A | 10/1996 |
| JP | 2703471 B2 | 1/1998 |
| JP | 2000-111952 A | 4/2000 |
| JP | 2008-543706 A | 12/2008 |
| JP | 2011-243968 A | 12/2011 |
| JP | 2015-514604 A | 5/2015 |
| WO | 2006/135832 A2 | 12/2006 |
| WO | 2014/078524 A1 | 5/2014 |
| WO | 2014/142036 A1 | 9/2014 |

OTHER PUBLICATIONS

Jun. 26, 2019 European Search Report issued in European Patent Application No. 16875773.0.
Feb. 7, 2017 International Search Report issued in Patent Application No. PCT/JP2016/087542.
Sep. 25, 2020 Office Action issued in Chinese Patent Application No. 201680073809A.

* cited by examiner

SAPPHIRE COMPOSITE BASE MATERIAL AND METHOD FOR PRODUCING THE SAME

TECHNICAL FIELD

The invention relates to a composite base material in which a single crystal sapphire film is formed on a surface of a glass material, the composite base material being used mainly for displays, etc.

BACKGROUND ART

Sapphire has the highest Mohs hardness next to diamond. Owing to its durability, i.e., higher resistance to scratches under everyday environments, sapphire is used for glasses of luxury watches or displays of cell phones, etc.

In general, glass is hard although not comparable to sapphire. Also, the glass can transmit visible light and has high chemical resistance and high surface lubricity. Thus, the glass has found its application in various industrial fields. The glass has another characteristic that when broken, its fragments easily scatter. To overcome the above, laminated glass, prepared by sandwiching a resin film between a pair of glass plates, is employed in glass windows of traffic vehicles such as automobiles, glass windows of buildings, or other such applications. In general, the laminated glass hardly scatters or falls down when broken because the glass and the resin are firmly bonded. Moreover, the laminated glass can be given a desired characteristic depending on which type of resin is sandwiched between the glass plates. Accordingly, some attempts have been made to further impart, for example, sound insulation (Patent Document 1).

PRIOR ART DOCUMENT

Patent Document

Patent Document 1: Japanese Patent No. 2703471

SUMMARY OF THE INVENTION

Problem to be Solved by the Invention

In resent years, a large quantity of single crystal sapphire substrates have been produced for LED applications, and industrial production of sapphire has been widely spread. However, sapphire is still a higher cost material than glass and is hard to process because of its hardness. Thus, an application of the sapphire to display protection is limited.

It is an object of the invention to provide a sapphire composite base material that costs low, hardly suffers from scratches on its surface, and rarely scatters when broken; and a method for producing the same.

Solution to the Problem

Through extensive studies on ion implantation/delamination techniques applied to production of SOI (Silicon on insulator) substrates, the inventors have found a sapphire composite base material containing an intermediate film between a sapphire film and an inorganic glass substrate.

In an aspect of the invention, there can be provided a sapphire composite base material comprising: an inorganic glass substrate, a polyvinyl butyral or silica intermediate film on the inorganic glass substrate, and a single crystal sapphire film on the intermediate film.

In another aspect of the invention, there can be provided a method for producing a sapphire composite base material comprising steps of: implanting hydrogen ions through a surface of a single crystal sapphire substrate to form an ion implantation layer inside the single crystal sapphire substrate; applying a solution containing polyvinyl butyral or a silica precursor onto at least one surface selected from the group consisting of the surface of the single crystal sapphire substrate before the ion implantation, the surface of the single crystal sapphire substrate after the ion implantation, and a surface of an inorganic glass substrate to be bonded to the single crystal sapphire substrate, followed by heating to form a polyvinyl butyral or silica intermediate film; bonding the surface of the single crystal sapphire substrate to the surface of the inorganic glass substrate via the intermediate film to obtain a bonded body; and dividing the bonded body along the ion-implanted layer to transfer a single crystal sapphire film to the inorganic glass substrate via the intermediate film.

Effect of the Invention

According to the production method of the invention, since the sapphire composite base material comprises the intermediate film between the single crystal sapphire film and the inorganic glass substrate, the sapphire composite base material has satisfactory bonding property and hardly scatters when broken. Also, the single crystal sapphire substrate, from which the single crystal sapphire film is divided to be transferred to the inorganic glass substrate, can be used again for production of a sapphire composite base material, thereby reducing the cost. Moreover, since the resultant sapphire composite base material has sapphire on the top, it hardly suffers from scratches on the surface and is suitable for display protection.

MODE FOR CARRYING OUT THE INVENTION

Figure 1:
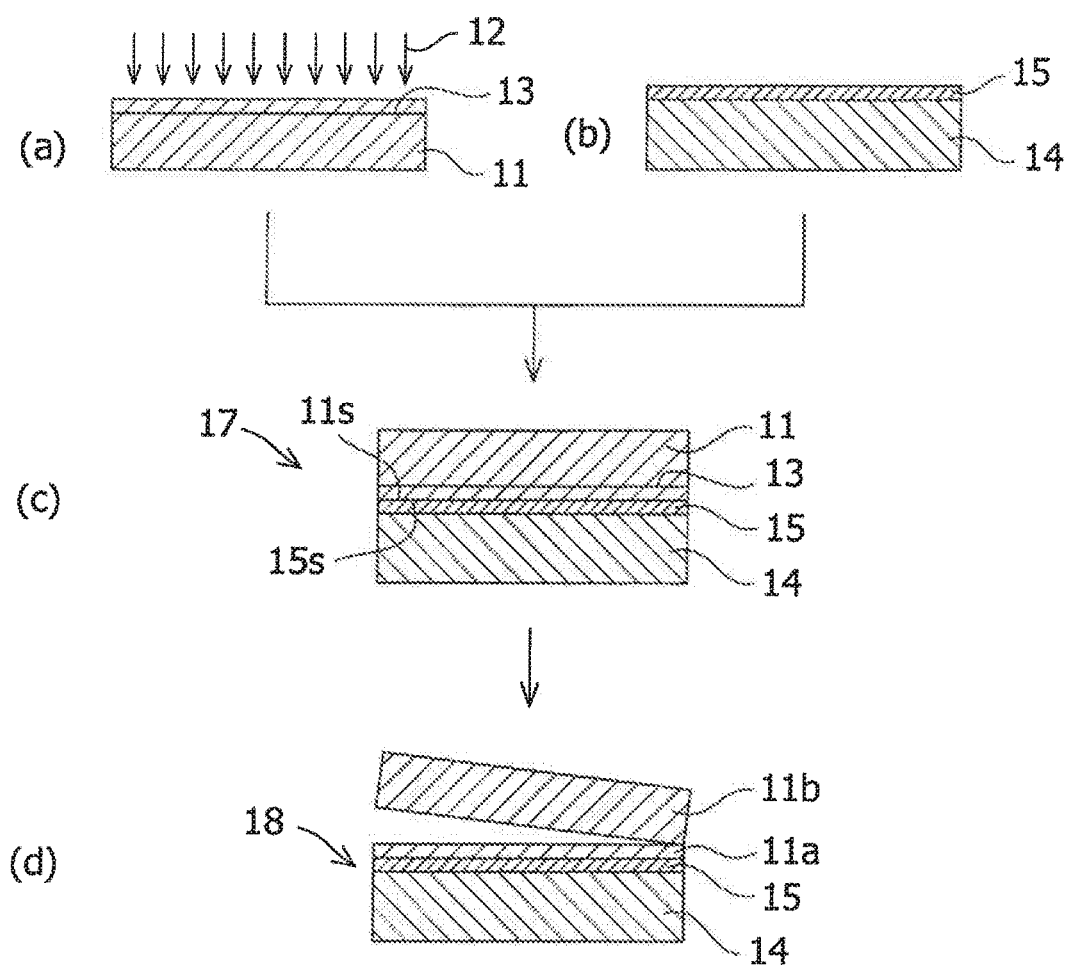
FIG. 1 exhibits schematic diagrams showing a method for producing a sapphire composite base material according to the invention.

Hereinafter, the best modes for carrying out the invention are described in detail but the scope of the invention is not limited to these modes.

In an embodiment of the invention, there can be provided a sapphire composite base material comprising an inorganic glass substrate, a polyvinyl butyral or silica intermediate film on the inorganic glass substrate, and a single crystal sapphire film on the intermediate film.

Examples of the inorganic glass substrate include a soda lime glass substrate, a borosilicate glass substrate, and a chemically strengthened glass substrate. In order to suppress warp upon bonding to the single crystal sapphire substrate, particularly preferred is, as a material of the substrate, soda lime glass, borosilicate glass, or chemically strengthened glass, each having a coefficient of thermal expansion of $5 \times 10^{-6}/°$ C. or more and $1 \times 10^{-5}/°$ C. or less at from 20 to 400° C., which is a temperature range in which a difference in coefficient of thermal expansion from sapphire is small. The inorganic glass substrate may be a single substrate selected from the above glasses, or may be a combination of two or more of the above glasses. Although the shape of the inorganic glass substrate is not particularly limited, the inorganic glass substrate may be a wafer having the diameter of 2 to 8 inches or a square plate of 2 to 8 inches on a side. The thickness of the inorganic glass substrate is not particularly limited. The thickness of the inorganic glass substrate may be 50 to 1000 μm.

The intermediate film is a polyvinyl butyral or silica film. Considering that the presence of the intermediate film improves a bonding strength between the single crystal sapphire substrate and the inorganic glass substrate, the polyvinyl butyral or silica film is suitable as the intermediate film. The intermediate film contains at least one layer and may have two or more layers, for example. It is preferable to set the total thickness of the intermediate film with one layer or two or more layers to be 0.1 to 2 μm.

Polyvinyl butyral (hereinafter referred to as "PVB") is poly[(2-propyl-1,3-dioxane-4,6-diyl)methylene](—[($C_7O_2H_{12}$)—$CH_2$]$_n$—), and a polyvinyl butyral film is formed by, for example, a coating method. Examples of commercially available polyvinyl butyral may include S-LEC KS-5 (manufactured by Sekisui Chemical Co., Ltd.).

Silica is expressed by $SiO_2$ and a silica film is obtained by a method comprising steps of: for example, coating to form a film of perhydropolysilazane, which is a silica precursor, and heating the film to convert the perhydropolysilazane into silica. Examples of commercially available perhydropolysilazane may include Tresmile (manufactured by Sanwa Chemical Co., Ltd.).

A method for forming the intermediate film is not particularly limited. It is preferably a coating method as mentioned above. Examples of the coating method may include spray coating, dip coating, spin coating, bar coating, blade coating, and casting. In the ease of forming an intermediate film by coating, a solution containing polyvinyl butyral or a silica precursor may be used.

Examples of a solvent in the polyvinyl butyral solution to be used in the coating method may include an alcohol solvent such as methanol, ethanol, isopropanol and n-butanol; an aromatic solvent such as toluene and xylene; an ester solvent such as ethyl acetate; a ketone solvent such as methyl ethyl ketone; and an ether solvent such as di-n-butyl ether. Depending on circumstances, the polyvinyl butyral solution may contain water. A polyvinyl butyral concentration in the solution is preferably 3 to 50 mass %.

The solution containing polyvinyl butyral may be, for example, applied onto a substrate surface and then, the solvent is removed to form a polyvinyl butyral intermediate film. The solvent is preferably removed by heating at 100 to 300° C. The heating time is preferably 1 to 30 minutes. The heating may be carried out under atmospheric pressure or reduced pressure (1000 to 0.1 Pa).

Examples of a solvent in the a silica precursor solution to be used in the coating method may include, when perhydropolysilazane is used as the silica precursor, an aromatic solvent such as xylene or dibutyl ether. A perhydropolysilazane concentration in the solution is preferably 1 to 30 mass %. The perhydropolysilazane solution may contain water for conversion into silica. Alternatively, after the application of the solution onto the substrate surface, the substrate is left to stand under humid conditions so as to add moisture.

For example, the perhydropolysilazane solution is applied onto a substrate surface, and then the solvent is removed by heating for conversion into silica to form a silica intermediate film. The heating temperature is preferably 100 to 300° C. for removing the solvent, etc., and is preferably 300 to 1000° C., more preferably 500 to 1000° C., for conversion into silica. Also, the removal of the solvent and the conversion into silica may be carried out preferably at a temperature-increasing rate of 1 to 10°/min. The heating time is preferably 5 to 120 minutes. The heating may be carried out under atmospheric pressure or reduced pressure (1000 to 0.1 Pa). The perhydropolysilazane is an inorganic polymer having basic units of —($SiH_2NH$)—. When heated in the air or water-vapor-containing atmosphere, the perhydropolysilazane reacts with water or oxygen to provide a fine amorphous $SiO_2$ film. Also, upon the conversion into silica, the reaction of the perhydropolysilazane with water generates ammonia as a by-product. Thus, in the ease of executing conversion into silica by use of, for example, a convection type humidification dryer, it is preferred to set an ammonia trap inside the humidification dryer.

The thickness of the single crystal sapphire film is preferably 0.05 to 2 μm, and more preferably 0.1 to 1 μm. When the thickness is less than 0.05 μm, a structurally damaged part caused by the ion implantation may not be removed later, and sufficient hardness of sapphire may not be ensured. When the thickness of the single crystal sapphire film is more than 2 μm, a high-power ion implantation device is required. Also, the thick single crystal sapphire film increases costs of a composite base material. Note that the structurally damaged part may be removed into a desired thickness of the single crystal sapphire film, for example, by etching with an etchant such as phosphoric acid or sulfuric acid, or by polishing. As described later, it is preferred to form the single crystal sapphire film by formation of an ion-implanted layer in a single crystal sapphire substrate, and separation along the ion-implanted layer, for example, to transfer the separated film to a desired substrate.

In another embodiment of the invention, there can be provided a method for producing a sapphire composite base material comprising an intermediate film between a single crystal sapphire film and an inorganic glass substrate.

A single crystal sapphire substrate is not particularly limited. A single crystal sapphire substrate having the diameter of 2 to 8 inches and the thickness of 200 to 800 μm may be used.

First, hydrogen ions are implanted through a surface of the single crystal sapphire substrate so as to form an ion-implanted layer inside the single crystal sapphire substrate. The ion-implanted layer is formed by implanting a predetermined dose of hydrogen ions ($H^+$) or hydrogen molecule ions ($H_2^+$) at an implantation energy which allows formation of the ion-implanted layer at a desired depth from the surface of the single crystal sapphire substrate. As the conditions for the ion implantation, the implantation energy may be, for example, 50 to 200 keV. The dose of hydrogen molecule ions ($H_2^+$) is preferably $1.0 \times 10^{16}$ atoms/cm$^2$ or more and $2.5 \times 10^{17}$ atoms/cm$^2$ or less, and more preferably $1.0 \times 10^{16}$ atoms/cm$^2$ to $2.0 \times 10^{17}$ atoms/cm$^2$. When the dose is less than $1.0 \times 10^{16}$ atoms/cm$^2$, the ion-implanted layer may possibly not be embrittled in a subsequent step. When the dose is more than $2.5 \times 10^{17}$ atoms/cm$^2$, microcavities may be formed at the surface through which ions are implanted during the ion implantation, leading to uneven substrate surface.

Next, a solution containing polyvinyl butyral or a silica precursor is applied onto at least one of the surface (i.e. the surface through which ions have been implanted) of the single crystal sapphire substrate and the surface of the inorganic glass substrate to be bonded to the single crystal sapphire substrate, followed by heating to form a polyvinyl butyral or silica intermediate film.

Optionally, the solution containing polyvinyl butyral or a silica precursor is applied onto at least one of the surface of the single crystal sapphire substrate before the ion implantation (i.e. the surface through which ions will be implanted), the surface of the single crystal sapphire substrate after the ion implantation (i.e. the surface through which ions have been implanted), and the surface of the inorganic glass substrate to be bonded to the single crystal sapphire substrate, followed by heating to form a polyvinyl butyral or silica intermediate film. In other words, a step of forming an ion-implanted layer and a step of forming an intermediate film may be carried out in reverse order depending on circumstances. For example, before the formation of an ion-implanted layer inside the single crystal sapphire substrate, a solution containing a silica precursor may be applied onto the surface of the single crystal sapphire substrate, followed by heating to form a silica intermediate film. Then, hydrogen ions may be implanted through the surface with the silica-based intermediate film to form an ion-implanted layer inside the single crystal sapphire substrate.

After the formation of an intermediate film, at least one of the surface the surface through which ions have been implanted) of the single crystal sapphire substrate and the surface of the inorganic glass substrate to be bonded to the single crystal sapphire substrate may be optionally subjected to surface activation treatment. In the case of forming an intermediate film on both of the substrate surfaces, at least one of the two intermediate film surfaces may be subjected to surface activation treatment. In the case of forming an intermediate film only on one of the two substrate surfaces, at least one of the intermediate film surface and the substrate surface may be subjected to surface activation treatment.

Examples of a surface activation treatment include plasma treatment, ozone water treatment, UV ozone treatment, and ion beam treatment. Regarding the treatment with plasma, for example, a washed substrate is placed in a vacuum chamber and plasma gas is introduced thereinto under reduced pressure (1.0 to $1.0 \times 10^5$ Pa). Then, the substrate is exposed to an RF plasma of about 100 W for about 5 to 120 seconds for the plasma treatment of the surface. Examples of the plasma gas include, when the surface is oxidized, an oxygen gas; and include, when the surface is not oxidized, a hydrogen gas, a nitrogen gas, an argon gas, and a mixed gas thereof. The treatment with plasma oxidizes and removes organic substances on the substrate surface, and further increases OH groups in the surface, thereby activating the surface. Regarding the treatment with ozone, an ozone gas is introduced into pure water, and the surface can be activated with active ozone. Regarding the treatment with UV ozone, UV light of short wavelength (about 195 nm) is irradiated to the air or oxygen gas to generate active ozone, which activates the surface. Regarding the treatment with an ion beam, the ion beam such as an Ar ion beam is applied to the surface under high vacuum ($<1 \times 10^{-6}$ Torr) to expose highly active dangling bonds, thereby activating the surface.

Next, the surface (i.e. the surface through which ions have been implanted) of the single crystal sapphire substrate and the surface of the inorganic glass substrate to be bonded to the single crystal sapphire substrate are bonded to obtain a bonded body. The bonding may be carried out at room temperature. After the bonding, the bonded body may be further heated preferably at 100 to 300° C. for 0.5 to 24 hours to enhance the bonding strength.

Next, the obtained bonded body is divided along the ion-implanted layer formed inside the single crystal sapphire substrate so as to transfer a single crystal sapphire film to the inorganic glass substrate via the intermediate film. As the division (or separation) method, mechanical impact, light irradiation, or heating may be applied to the ion-implanted layer so as to divide the bonded body. One or a combination of the above division methods may be used.

Applying the mechanical impact to the ion-implanted layer for mechanical separation causes no thermal distortion, cracking, peeling of a bonded surface, etc. which will occur by heating. The mechanical separation preferably proceeds from one end to the other end through cleavage. It is also possible to adopt a separation method with a cleavage member, preferably, a wedge-like member such as a wedge. In this case, the wedge is inserted to the ion-implanted layer (implantation interface) so that the cleavage proceeds along with the deformation caused by the wedge. This method should be applied avoiding the risk of any damage or generation of particles at a contact part with the wedge, or the risk of cracking of the substrate caused by excessive deformation of the substrate as a result of driving the wedge. For example, a jet of fluid such as gas or liquid may be continuously or intermittently sprayed from the side of the bonded body to apply an impact to the ion-implanted layer. However, any method in which mechanical impact is applied to cause mechanical separation may be used.

For the separation by light irradiation, visible light is preferred. Since the ion implantation interface and its vicinities in the single crystal sapphire substrate are amorphized, they are susceptible to visible light and selectively susceptible to the energy. Such a mechanism ensures embrittlement of the ion-implanted layer for separation. Also, this separation method is simpler than the mechanical separation and thus preferable. Preferable examples of a light source of visible light are Rapid Thermal Annealer (RTA), green laser light, and flash lamp light.

For the separation by heating, it is preferably heated at 150 to 500° C. The heating time is preferably 0.5 to 24 hours. In general, the heating temperature for separation is preferably higher than the aforementioned temperature for enhancing the bonding strength. Depending on circumstances, while making the heating temperature for separation same as that for enhancing the bonding strength, the heating time may be controlled to achieve the separation.

As mentioned above, separation is carried out along the ion-implanted layer of the bonded body to obtain a sapphire composite base material comprising the intermediate film between the single crystal sapphire film and the inorganic glass substrate.

According to the invention, a method for producing the sapphire composite base material is not particularly limited. An embodiment of the method is shown in FIG. 1. Hydrogen ions 12 are implanted through a surface of a single crystal sapphire substrate 11 to form an ion-implanted layer 13 inside the single crystal sapphire substrate 11 (in step a). A solution containing polyvinyl butyral or a silica precursor is applied onto the surface of the inorganic glass substrate 14 to be bonded to the single crystal sapphire substrate, and then the substrate 14 is heated to form a polyvinyl butyral or silica intermediate film 15 (in step b). A surface 15s, at which the intermediate film 15 has been formed, of the inorganic glass substrate 14 to be bonded to the single crystal sapphire substrate, is bonded to the surface 11s (i.e. the surface through which ions have been implanted) of the single crystal sapphire substrate 11 to obtain a bonded body 17 (in step c). A single crystal sapphire substrate 11b is separated off along the ion-implanted layer 13 of the bonded body 17 to obtain a sapphire composite base material 18 in which a single crystal sapphire film 11a is transferred to the inorganic glass substrate 14 via the intermediate film 15 (in step d).

Figure 2:
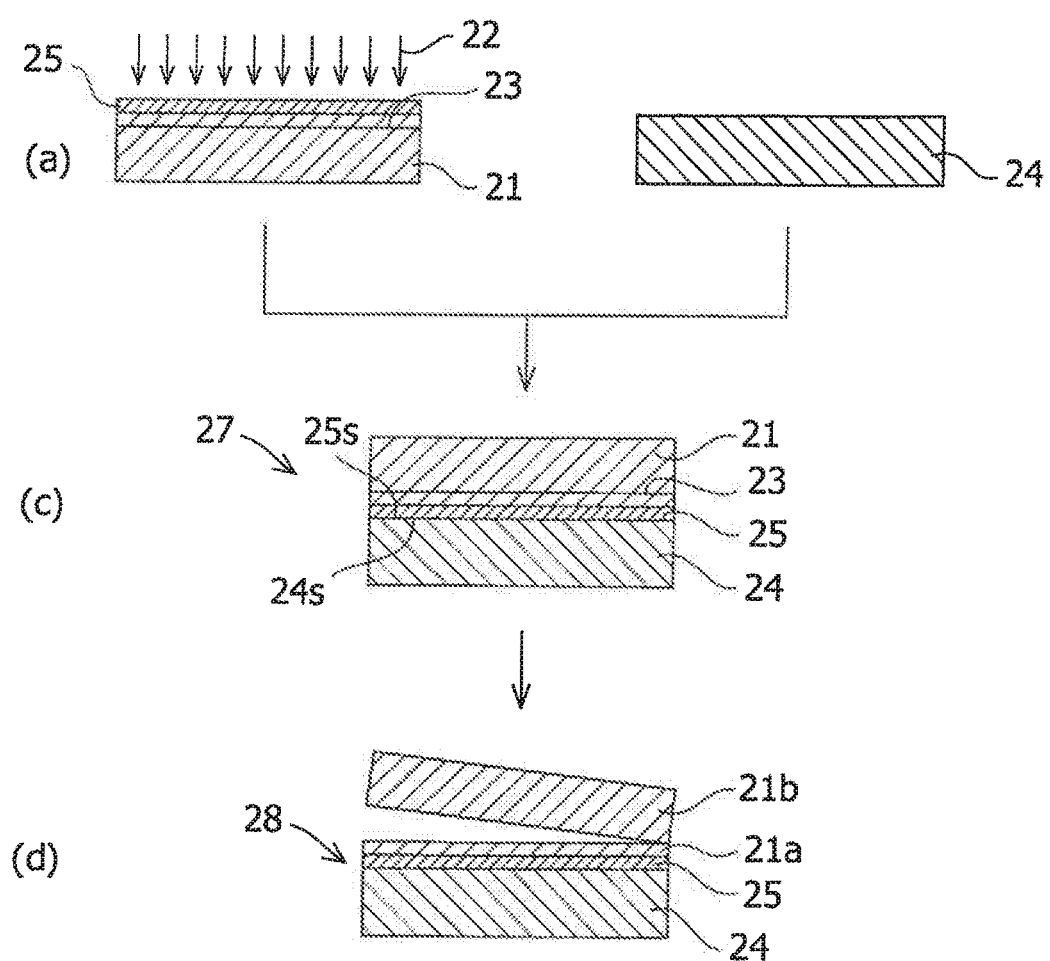
FIG. 2 exhibits schematic diagrams showing another method for producing a sapphire composite base material according to the invention.

According to the invention, another embodiment of the method for producing the sapphire composite base material is shown in FIG. 2. A solution containing a silica precursor is applied onto a surface of a single crystal sapphire substrate 21, and then the substrate 21 is heated to form a silica intermediate film 25. Hydrogen ions 22 are implanted through a surface of the intermediate film 25 on the single crystal sapphire substrate 21 to form an ion-implanted layer 23 inside the single crystal sapphire substrate 21 (in step a). A surface 24s of an inorganic glass substrate 24 is bonded to a surface 25s of the intermediate film on the ion-implanted single crystal sapphire substrate 21 to obtain a bonded body 27 (in step c). A single crystal sapphire substrate 21b is separated off along the ion-implanted layer 23 of the bonded body 27 to obtain a sapphire composite base material 28 in which a single crystal sapphire film 21a is transferred to the inorganic glass substrate 24 via the intermediate film 25 (in step d).

EXAMPLES

Example 1

A substrate having the diameter of 6 inches and the thickness of 600 µm was used as a single crystal sapphire substrate. Through the surface of the single crystal sapphire substrate, $H_2^+$ ions were implanted at an energy of 150 KeV and a dose of $2.0 \times 10^{17}$ atoms/cm$^2$ to form an ion-implanted layer inside the single crystal sapphire substrate (at the depth of about 500 nm).

As the inorganic glass substrate, a borosilicate glass substrate having the diameter of 6 inches and the thickness of 600 µm was used. To the surface of the borosilicate glass substrate to be bonded to the surface (i.e. the surface through which ions have been implanted) of the single crystal sapphire substrate, an ethanol solution of polyvinyl butyral (PVB; S-LEC KS-5, 10 mass %, manufactured by Sekisui Chemical Co., Ltd.) was applied in the ambient atmosphere at room temperature by use of a spin coater. Then, the coated surface was heated at atmospheric pressure in the ambient atmosphere at 100° C. for 10 minutes to form an intermediate film (with the thickness of 150 nm).

The surface of the intermediate film on the single crystal sapphire substrate, and the surface of the intermediate film on the inorganic glass substrate were subjected to plasma activation treatment by an RF plasma generator under reduced pressure (1.0 to $1.0 \times 10^5$ Pa) in the nitrogen atmosphere at room temperature. After that, the plasma-activated surfaces of the single crystal sapphire substrate and inorganic glass substrate were brought into contact for bonding at atmospheric pressure in the ambient atmosphere at room temperature to obtain a bonded body. A blade was inserted to the ion-implanted layer of the bonded body to mechanically separate the single crystal sapphire film, thereby transferring the single crystal sapphire film to the borosilicate glass substrate via the PVB film. As a result, a sapphire composite base material in the form of the sapphire film/PVB/borosilicate glass substrate was obtained.

The cross-sectional structure of the sapphire composite base material was observed (but not shown) with a transmission electron microscope (TEM). The observation shows that the single crystal sapphire film was transferred onto the intermediate film, and the intermediate film served as a binder film between the single crystal sapphire film and the glass substrate.

Example 2

Figure 3:
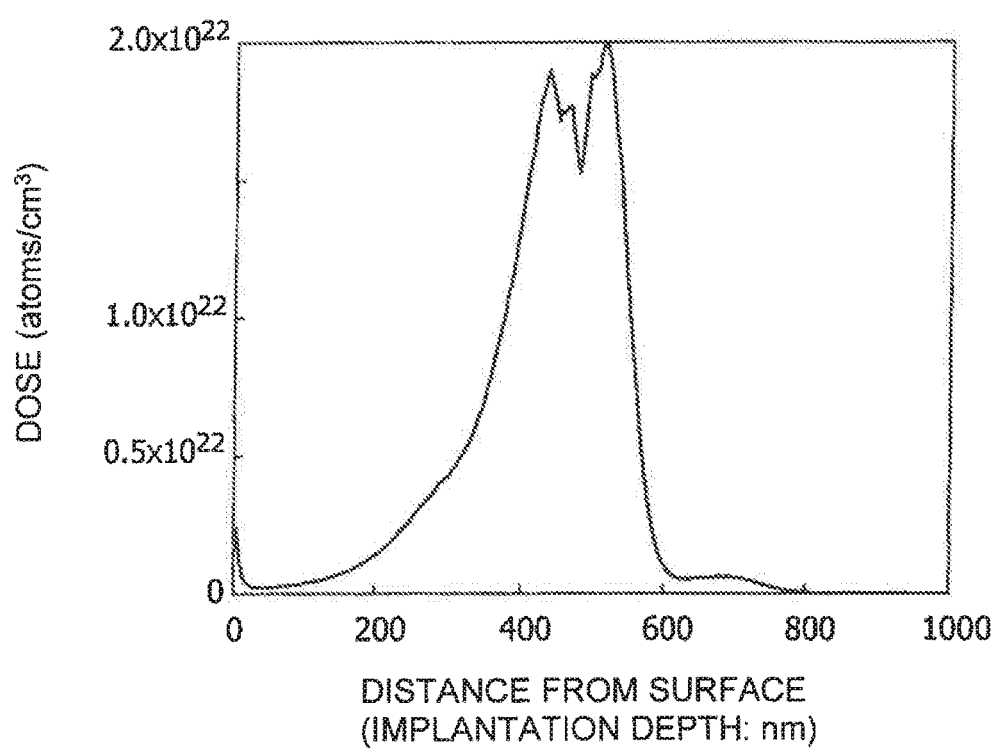
FIG. 3 shows SIMS measurement results of a single crystal sapphire substrate after implantation of $H_2^+$ ions in Example 2 according to the invention.

As the single crystal sapphire substrate, the substrate having the diameter of 6 inches and the thickness of 600 µm was used. From the surface of the single crystal sapphire substrate, $H_2^+$ ions were implanted at an energy of 150 KeV and a dose of $2.0 \times 10^{17}$ atoms/cm$^2$ to form an ion-implanted layer inside the single crystal sapphire substrate. FIG. 3 shows an ion dose at each position distant from the ion-implanted substrate surface, as measured with SIMS (Secondary Ion Mass Spectrometry). The measurement results show that the ion-implanted layer was formed at the depth of about 500 nm from the surface at the above ion dose.

As the inorganic glass substrate, a borosilicate glass substrate having the diameter of 6 inches and the thickness of 600 µm was used. To the surface of the borosilicate glass substrate to be bonded to the surface (i.e. the surface through which ions have been implanted) of the single crystal sapphire substrate, a solution of polysilazane (Tresmile, 20 mass %, manufactured by Sanwa Chemical Co., Ltd.) in di-n-butyl ether was applied in the ambient atmosphere at room temperature by use of a spin coater. After that, the coated surface was heated under atmospheric pressure in the ambient atmosphere at 200° C. for 3 minutes for conversion into silica, and was further heated at 450° C. for 30 minutes for curing so as to form an intermediate film (with the thickness of 150 nm).

The surface of the intermediate film on the single crystal sapphire substrate and the surface of the intermediate film on the inorganic glass substrate were subjected to plasma activation treatment under reduced pressure (1.0 to $1.0 \times 10^5$ Pa) in nitrogen atmosphere at room temperature by use of an RF plasma generator. After that, the plasma-activated surfaces of the single crystal sapphire substrate and inorganic glass substrate were brought into contact for bonding under atmospheric pressure in the ambient atmosphere at room temperature to obtain a bonded body. By inserting a blade into the ion-implanted layer of the bonded body, a single crystal sapphire film was mechanically separated to transfer the single crystal sapphire film to the borosilicate glass substrate via a silica film. As a result, a sapphire composite base material in the form of the sapphire film/silica film/borosilicate glass substrate was obtained.

Figure 4:
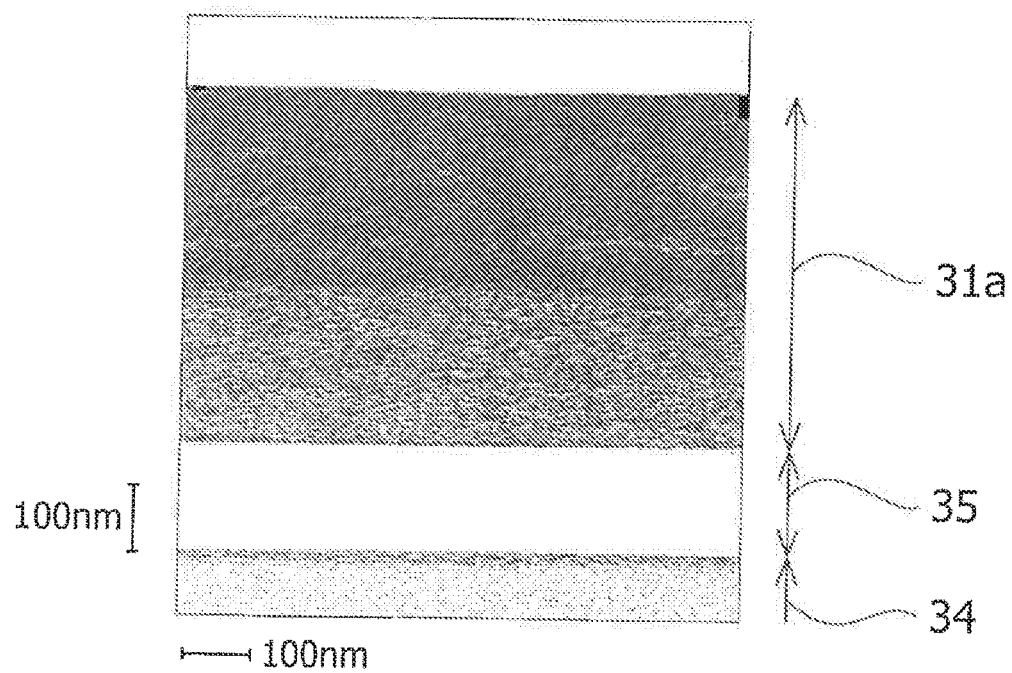
FIG. 4 is a TEM image of the sapphire composite base material in Example 2 according to the invention.

FIG. 4 shows results of observing the cross-sectional structure of the resultant sapphire composite base material with a transmission electron microscope. The observation result shows that a single crystal sapphire film (31a) of about 500 nm thickness was transferred to an inorganic glass substrate (34) via an intermediate film (35), and the intermediate film served as a binder film. Since a surface layer of the single crystal sapphire film (31a) was still structurally damaged by ion implantation, the surface layer may be optionally etched with an etchant or polished, depending on types of the applications.

DESCRIPTION OF REFERENCE NUMERALS 11, 21 single crystal sapphire substrate
11s single crystal sapphire substrate surface
11a, 21a single crystal sapphire film
11b, 21b separated single crystal sapphire substrate 12, 22 hydrogen ion
13, 23 ion-implanted layer
14, 24 inorganic glass substrate
24s inorganic glass substrate surface
15, 25 intermediate film
15s surface of intermediate film on inorganic glass substrate
25s surface of intermediate film on single crystal sapphire substrate
17, 27 bonded body
18, 28 sapphire composite base material
31a single crystal sapphire film
34 inorganic glass substrate
35 intermediate film

The invention claimed is:

1. A method for producing a sapphire composite base material, comprising the steps of:
   implanting hydrogen ions through a surface of a single crystal sapphire substrate to form an ion-implanted layer inside the single crystal sapphire substrate;
   applying a solution containing a silica precursor onto at least one surface selected from the group consisting of the surface of the single crystal sapphire substrate before the ion implantation, the surface of the single crystal sapphire substrate after the ion implantation, and a surface of an inorganic glass substrate to be bonded to the single crystal sapphire substrate, followed by heating to form a silica intermediate film;
   bonding the surface of the single crystal sapphire substrate to the surface of the inorganic glass substrate via the intermediate film to obtain a bonded body; and
   dividing the bonded body along the ion-implanted layer to transfer a single crystal sapphire film to the inorganic glass substrate via the intermediate film.

2. The method for producing a sapphire composite base material according to claim 1, wherein the silica precursor is comprised of perhydropolysilazane.

3. The method for producing a sapphire composite base material according to claim 1, wherein the hydrogen ions are hydrogen molecular ions, and a dose of the hydrogen molecular ions is $1.0 \times 10^{16}$ atoms/cm$^2$ or more and $2.5 \times 10^{17}$ atoms/cm$^2$ or less.

4. The method for producing a sapphire composite base material according to claim 1, wherein in the step of dividing, mechanical impact, light and/or heat is applied to the ion-implanted layer to divide the bonded boy.

5. The method for producing a sapphire composite base material according to claim 1, wherein the single crystal sapphire film has a thickness of 0.05 to 2 μm.

6. The method for producing a sapphire composite base material according to claim 1, wherein a material of the inorganic glass substrate is selected from the group consisting of soda lime glass, borosilicate glass, and chemically strengthened glass, each having an expansion coefficient of $5 \times 10^{-6}$° C. or more and $1 \times 10^{-5}$° C. or less at from 20 to 400° C.

* * * * *